(12) United States Patent
Aoki et al.

(10) Patent No.: US 6,453,258 B1
(45) Date of Patent: Sep. 17, 2002

(54) OPTIMIZED BURN-IN FOR FIXED TIME DYNAMIC LOGIC CIRCUITRY

(75) Inventors: Naoaki Aoki; Sang Hoo Dhong, both of Austin, TX (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/465,176

(22) Filed: Dec. 17, 1999

(51) Int. Cl.$^7$ ................................................. G06F 1/04
(52) U.S. Cl. ........................ 702/120; 702/116; 702/118
(58) Field of Search ........................... 307/443; 29/840; 326/58, 93; 714/724; 327/200; 702/120, 116, 118

(56) References Cited

U.S. PATENT DOCUMENTS

| | | | |
|---|---|---|---|
| 4,571,724 A | * 2/1986 | Belmondo et al. | 371/25 |
| 5,289,631 A | * 3/1994 | Koopman et al. | 29/840 |
| 5,293,340 A | 3/1994 | Fujita | |
| 5,309,446 A | 5/1994 | Cline et al. | |
| 5,329,176 A | * 7/1994 | Miller, Jr. et al. | 307/443 |
| 5,341,096 A | 8/1994 | Yamamura | |
| 5,371,710 A | 12/1994 | Ogihara | |
| 5,375,091 A | 12/1994 | Berry, Jr. et al. | |
| 5,467,356 A | * 11/1995 | Choi | 371/21.1 |
| 5,590,079 A | 12/1996 | Lee et al. | |
| 5,638,331 A | * 6/1997 | Cha et al. | 365/201 |
| 5,694,364 A | 12/1997 | Morishita et al. | |
| 5,708,374 A | * 1/1998 | Durham et al. | 326/93 |
| 5,724,249 A | * 3/1998 | Kodali et al. | 364/488 |
| 5,798,653 A | 8/1998 | Leung, Jr. | |
| 5,852,581 A | 12/1998 | Beffa et al. | |
| 5,896,399 A | * 4/1999 | Lattimore et al. | 371/21.4 |
| 5,898,629 A | 4/1999 | Beffa et al. | |
| 6,122,760 A | * 9/2000 | Grosch et al. | 714/724 |
| 6,215,324 B1 | * 4/2001 | Yoshida | 324/760 |
| 6,218,202 B1 | * 4/2001 | Yew et al. | 438/15 |
| 6,232,798 B1 | * 5/2001 | Coulman et al. | 326/93 |
| 6,286,117 B1 | * 9/2001 | Yum et al. | 714/724 |

FOREIGN PATENT DOCUMENTS

JP 1224682 A 9/1989

* cited by examiner

Primary Examiner—Marc S. Hoff
Assistant Examiner—Felix Suarez
(74) Attorney, Agent, or Firm—Casimer K. Salys; Bracewell & Patterson, L.L.P.

(57) ABSTRACT

A system and method for ensuring comprehensive testing coverage of components within a dynamic logic macro during a burn-in test cycle. Burn-in testing is initiated within dynamic logic circuit having a dynamic logic block and a self-reset loop for generating a reset signal. A multiple phase burn-in test input is applied to the self-reset loop for modifying the duration of the reset signal during burn-in testing, such that the components within the dynamic logic macro are adequately stressed during the burn-in test cycle.

14 Claims, 8 Drawing Sheets

OPTIMIZED BURN-IN FOR FIXED TIME DYNAMIC LOGIC CIRCUITRY

TECHNICAL FIELD

The present invention relates in general to dynamic logic macros having internal fixed-width pulse timing control and in particular to a system and method for optimizing burn-in testing of circuitry containing such macros. More particularly, the present invention relates to an improved burn-in test method and system whereby individual devices within dynamic logic macros are stressed for an adequate period during each burn-in cycle.

DESCRIPTION OF THE RELATED ART

Burn-in Testing

Burn-in testing generally refers to testing equipment by operating it under specified conditions for a specified period of time. Since, most hardware problems that occur in modern digital electronic systems occur in the first few hours of operation (so-called "infant mortality"), it is desirable to perform burn-in testing of such systems before they are sold.

Properly planned and conducted burn-in testing is a well-known method of reliability screening at the component level. By subjecting individual devices to the stress of burn-in test conditions which include temperature stress, electrical stress, temperature cycling, etc., a macro developer can identify specific faults that would be more difficult to perceive at the macro, module, or system level.

Self-Resetting Logic

Self-resetting dynamic logic macros have been designed in part to eliminate the need to utilize a system clock signal with which to correctly synchronize all logic operations within very large scale integrated (VLSI) circuitry. Such self-resetting circuitry has generally been implemented utilizing Complementary Metal Oxide Semiconductor (CMOS) technology and is thus commonly referred to as SRCMOS. Further background information relating to self-resetting dynamic logic circuitry may be found with reference to U.S. Pat. No. 5,434,519, U.S. Pat. No. 5,565,798, and U.S. Pat. No. 5,329,176 which are incorporated herein by reference.

The timing signals generated by self-resetting logic techniques are characterized as having a fixed pulse with respect to the input signals (often data input) which cause the triggering of self-reset circuits. Such fixed-timing signals are useful for internal clocking or strobing. When a self-reset initiated signal is utilized as a strobe (within a Programmable Logic Array (PLA) control module, for example) is it necessary to maintain the control path properly synchronized with related logic data transfer (the data path).

Due to ever increasing speed demands, microprocessor designs are often implemented utilized delayed-reset and self-resetting dynamic circuit macros. During normal operation, latches within such macros generate narrow, fixed-width pulses. The reset signal generated at the last stage of a dynamic logic pipe is a fixed-width pulse derived from the same clock edge that controls the input sampling latch. Thus, these macros operate internally with fast fixed-width pulses even with the typically slow clocking applied during burn-in testing. Many devices within such macros would thus be stressed for only a small fraction of the burn-in cycle time.

FIG. 1 is a high-level block diagram depicting the fixed control timing for a dynamic logic circuit 100 having a stretched output. As illustrated in FIG. 1, dynamic logic circuit 100 is a sequential logic structure which utilizes storage devices such as input latch 102 and output latch 108 to capture the output of each processing (logic) stage at the end of each clock period. During normal operation, latch 102 delivers fixed pulse width pulses from output 118. Are set signal within logic block 104 is conventionally derived from a fixed-width pulse applied from a control input 112 derived from the same clock edge that controls latch 102. Thus, dynamic logic circuit 100 operates with either an external or internally-generated reset signal typically having fast fixed-pulse widths even with the low global clock frequencies typical of burn-in testing.

A logic output from an output 120 of logic block 104 is stretched at pulse stretcher 106 in order to meet the receiving hold-time requirements of output latch 108 independent of internal timing control frequencies of reset signals from control input 112. During normal operation of dynamic logic circuit 100, a reset signal input 114 into pulse stretcher 106 is derived from global clock signal CLK 110. Reset signal 112, which resets logic within logic block 104, may be derived from either CLK 110 or from control timing signals generated from the self-resetting technique described in firer detail with reference to FIG. 2 or other clock-shaping techniques. Pulse widths of reset signals applied from reset inputs 112 and 114 are thus fixed and independent of the frequency of CLK 110.

The generation of fixed-width control timing signals such as reset signals from reset input 112, is depicted in FIG. 2, which is a schematic diagram illustrating fixed-timing characteristics of a conventional self-resetting circuit 200. As shown in FIG. 2, self-resetting circuit 200 comprises a dynamic logic stage 202 and a reset delay path 203. Dynamic logic stage 202 is a type of circuit known in the art as a domino circuit which includes a pre-charge device such as P-type field effect transistor (PFET, 208, The gate terminal of PFET 208 is coupled to reset node 218, the source terminal of PFET 208 is coupled to a supply voltage, $V_{dd}$, and the drain terminal of PFET 208 is coupled to the input at dynamic node 204 of a logic network 214.

Although not explicitly shown in FIG. 2, logic network 214 typically comprises a network of one or more interconnected N-type field effect transistors (NFETs) that may define a particular gate type, such as an AND or OR gate. Logic network 214 also receives one or more data input signals 216 that, depending upon the topology of its internal NFET network, define the conditions under which it discharges dynamic node 204. The output of logic network 214 is connected to the source terminal of an evaluate device such as an NFET 210. The gate terminal of NFET 210 is connected to the timing control signal provided at reset node 218, and its drain terminal is connected to ground. It is through NFET 210 that logic network 214 discharges dynamic node 204. A feedback of half-latch device, PFET 206, is connected in parallel with PFET 208, i.e., the node at which the drain terminal of PFET 206 is connected to $V_{dd}$ and its drain is also connected to dynamic node 204.

Dynamic node 204 provides the input to an inverter 212 from which a data path continues at output node 205 which serves as the data output of self-resetting circuit 200. The data path at output node 205 also serves as the origination of a "reset" signal that results when a signal at output node 205 is delayed a fixed amount as it propagates through self-reset module 203. The resetting of dynamic circuit 202 and concurrent generation of fixed-width timing control signals is explained as follows. When input data 216 arrives, dynamic node 204 discharges to a logic low, causing output node 205 to go high. After propagating through inverters 207, 209, and 211, the reset signal at node 218 goes low.

Thus, after the delay through the self-reset loop, dynamic node 204 is pre-charged to a logic high. This process results in a fixed-width pulse generated at nodes 205, 220, and 222 all or some of which may be utilized as timing control signals for external circuits. The fixed-pulse width signal at node 205 propagates to the next logic stage.

This fixed-timing characteristic of dynamic logic self-resetting macros conflicts with one of the fundamental goals of burn-in testing which is to sufficiently stress individual devices. When burn-in testing has been conventionally applied to fixed-delay circuits, adequate testing of individual devices is often impossible even with extended testing. Therefore, although the burn-in operation is performed at very low frequencies, some devices are not stressed for a long enough period of time to meet burn-in testing goals. If it is absolutely necessary to stress these devices, the burn-in operation has conventionally been prolonged. Such extended burn-in testing results in higher testing costs and also in possible over-stressing some components which defeats the primary goal of burn-in testing—circuit reliability.

From the foregoing it can be appreciated that a need exists for a system and method for implementing a multiple cycle timing mode during burn-in testing of fixed-timing macros. If implemented, such a system and method would extend the active period for fixed-timing devices during each burn-in cycle thus ensuring adequate stressing of all devices within such macros.

SUMMARY OF THE INVENTION

It is therefore one object of the present invention to provide a system and method for optimizing burn-in testing of dynamic logic circuit macros that utilize fixed-width pulse timing control.

It is another object of the present invention to provide an improved timing control method and system whereby devices within dynamic logic macros are stressed for an adequate period during a burn-in cycle.

Some or all of the foregoing objects may be achieved in one embodiment of the present invention as is now described.

The above as well as additional objects, features, and advantages of the present invention will become apparent in the following detailed written description. A system and method are disclosed for ensuring comprehensive testing coverage of components within a dynamic logic macro during a burn-in test cycle. Burn-in testing is initiated within dynamic logic circuit having a dynamic logic block and a self-reset loop for generating a reset signal. A multiple phase burn-in test input is applied to the self-reset loop for modifying the duration of the reset signal during burn-in testing, such that the components within the dynamic logic macro are adequately stressed during the burn-in test cycle.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 5b illustrates a transistor level diagram of a NAND gate within the reset timing control path depicted in FIG. 5a;

DETAILED DESCRIPTION OF AN ILLUSTRATIVE EMBODIMENT

In the following description, numerous specific details are set forth regarding component parts, interconnections, etc. to provide a thorough understanding of how a preferred embodiment of the present invention may be implemented. However, those skilled in the art will appreciate and understand the extensions necessary to practice the present invention without being limited to such application-specific details. Most details related to specific timing parameters and the like have been omitted inasmuch as such details are not necessary to obtain a complete understanding of the present invention and are within the knowledge of those skilled in the relevant art.

Figure 1:
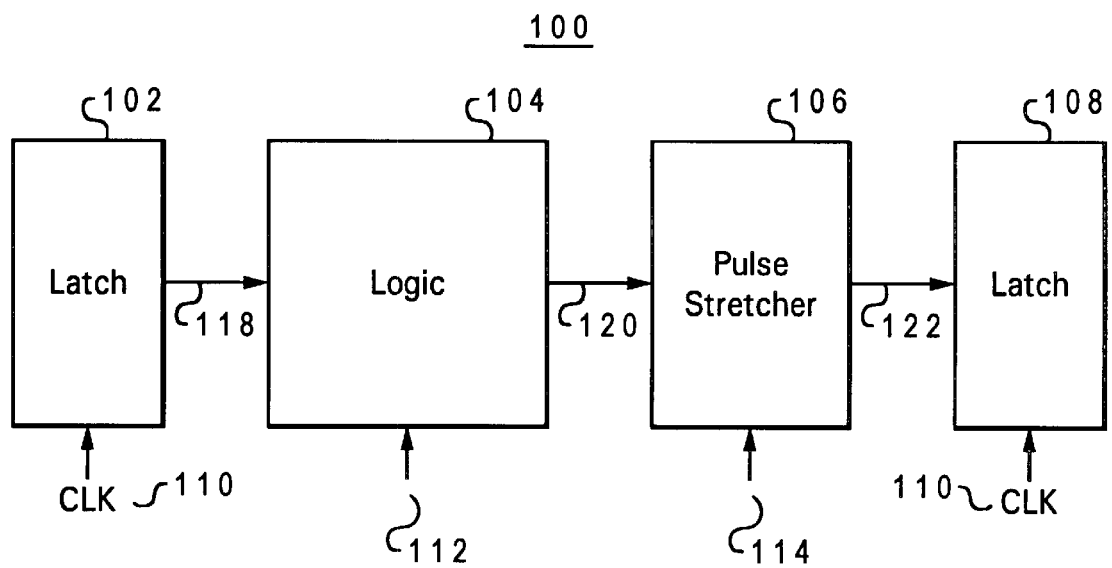
FIG. 1 is a high-level block diagram depicting fixed control timing typically found with conventional dynamic logic circuits.
Figure 3:
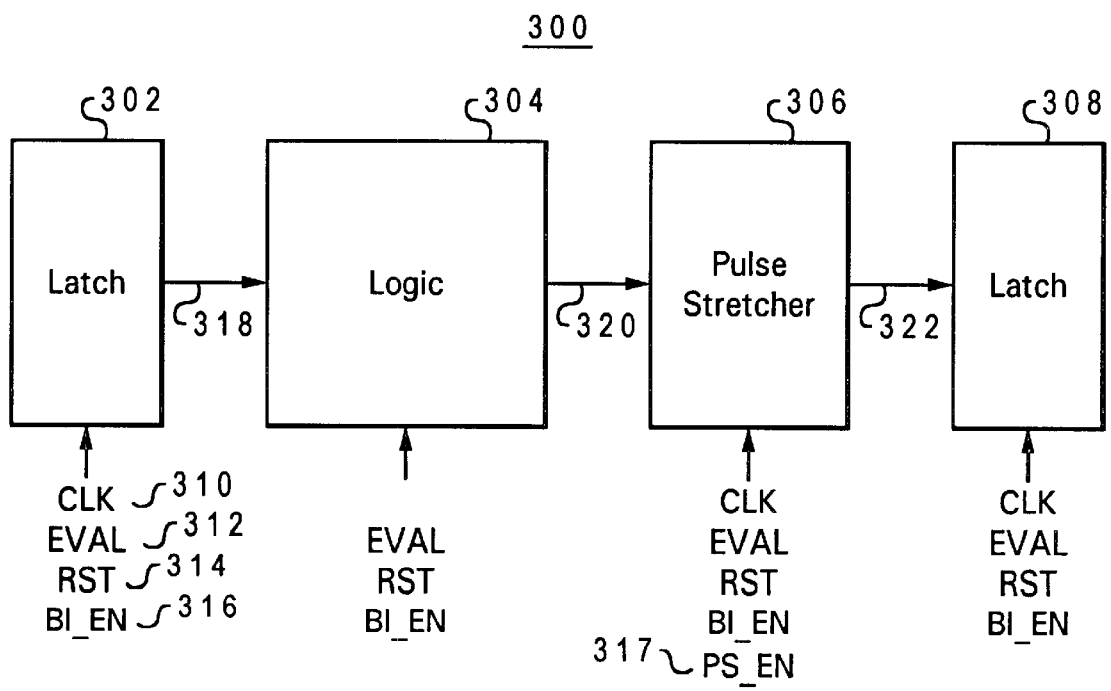
FIG. 3 is a high-level block diagram depicting a timing control scheme for burn-in testing of a fixed-timing dynamic logic macro in accordance with one embodiment of the present invention.

With reference now to FIG. 3, a high-level block diagram depicts the timing control utilized during burn-in testing of a fixed-timing dynamic logic circuit 300 in accordance with one embodiment of the present invention. In order to meet the burn-in goal of stress reliability, each individual component within each of blocks 302, 304, 306, and 308 must be enabled for an adequate period of time during each burn-in cycle. Due to the fast and fixed-pulse width characteristics of the conventional dynamic logic circuits depicted in FIGS. 1 and 2, all of the internal signals within latch 302, logic block 304, and pulse stretcher 306 must be extended during burn-in testing.

The present invention addresses the need to extend such signals by utilizing a multi-phase timing control scheme. In one embodiment, a three-phase timing scheme is implemented by applying three clock-like signals, EVAL 312, RST 314, and PS_EN 317, in addition to a clock CLK 310. As illustrated and explained in further detail with reference to FIGS. 4, 5, and 6, EVAL 312 and RST 314 function as timing control signals which extend the period over which individual devices, such as transistors, within latch 302, logic block 304, pulse stretcher 306, and latch 308, are active during each burn-in cycle. PS_EN 317 together with another control signal, BI_EN 316, provide resistance to noise which is particularly important during the high-voltage, high-temperature conditions under which burn-in testing is conducted. A latch output 318, logic output 320, and pulse stretcher (PS) output 322, are shaped in accordance with CLK 310, EVAL 312, RST 314, and PS_EN 317 as next described with reference to FIG. 4.

TABLE 1

| Signal Name | Signal Polarities | |
|---|---|---|
| | Normal Operation | Burn-in Operation |
| EVAL | HIGH | TOGGLE |
| RST | HIGH | TOGGLE |
| BI_EN | HIGH | LOW |
| PS_EN | HIGH | TOGGLE |

Figure 4:
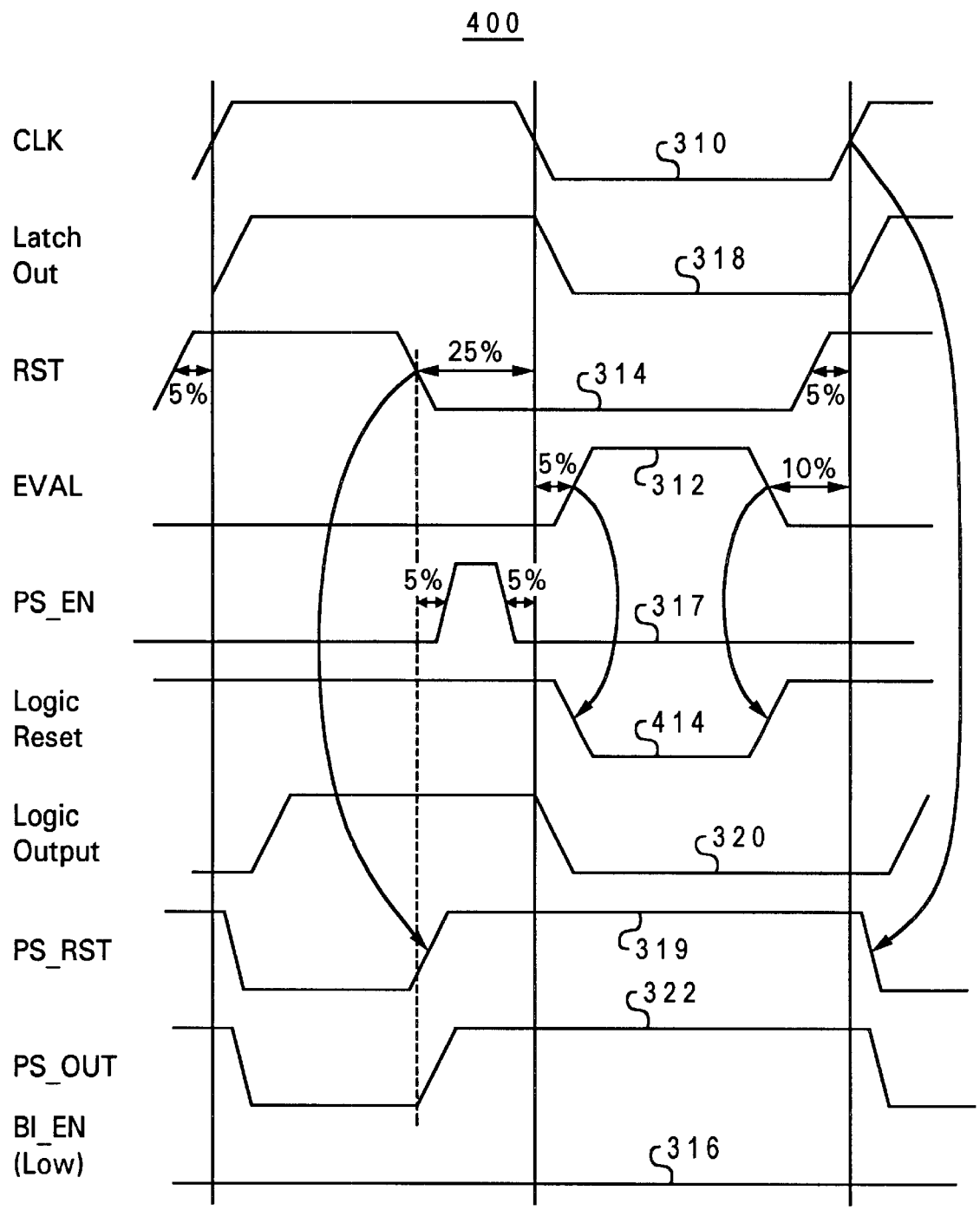
FIG. 4 is a timing diagram illustrating operation of a three-phase clock mode applied to the dynamic logic macro illustrated in FIG. 3 in accordance with one embodiment of the present invention.

Turning now to FIG. 4, a timing diagram 400 illustrates operation of a three-phase dynamic clock mode applied to the dynamic logic pipeline 300 illustrated in FIG. 3 in accordance with one embodiment of the present invention. Latch output 318 is initiated by CLK 310 having a period which, during burn-in testing designates a single burn-in cycle. As seen in FIG. 4, latch output 318 follows the burn-in cycle period of CLK 310 and, referring back to FIG. 3, is received as data input at logic block 304. Again referring to FIG. 3, it will be noted that logic block 304 receives timing control inputs EVAL 312 and RST 314 which serve to extend internal transistor activation within logic block 304 and pulse stretcher 306.

This extended transistor activation is evidenced in FIG. 4 by examination of logic output 320, PS output 322, an internal logic reset 414, and an internal PS_RST 319. As illustrated in FIG. 4, RST 314 is deactivated (switched to logic high) just prior to the leading edge of CLK 310 and extends through most of the first half-cycle of latch out 318. Logic block 304 responds to this first timing control phase by maintaining a logic high at output 320 through approximately half of the burn-in cycle period as defined by CLK 310. A second phase in the three-phase control scheme is initiated by activation of PS_EN 317, which occurs between the falling edge of RST 314 and the rising edge of EVAL 312. The third phase in the three-phase timing control scheme illustrated in FIG. 4 is initiated by the rising edge EVAL 312 which lags behind the falling edge of RST 314 by a pre-determined timespan (30% of burn-in cycle in the depicted example). As illustrated in FIG. 4, EVAL 312 drives logic reset 414 within logic block 304. It must be noted that logic reset 414 is a distinct and separate signal from RST 314 which is activated only during burn-in testing.

Figure 2:
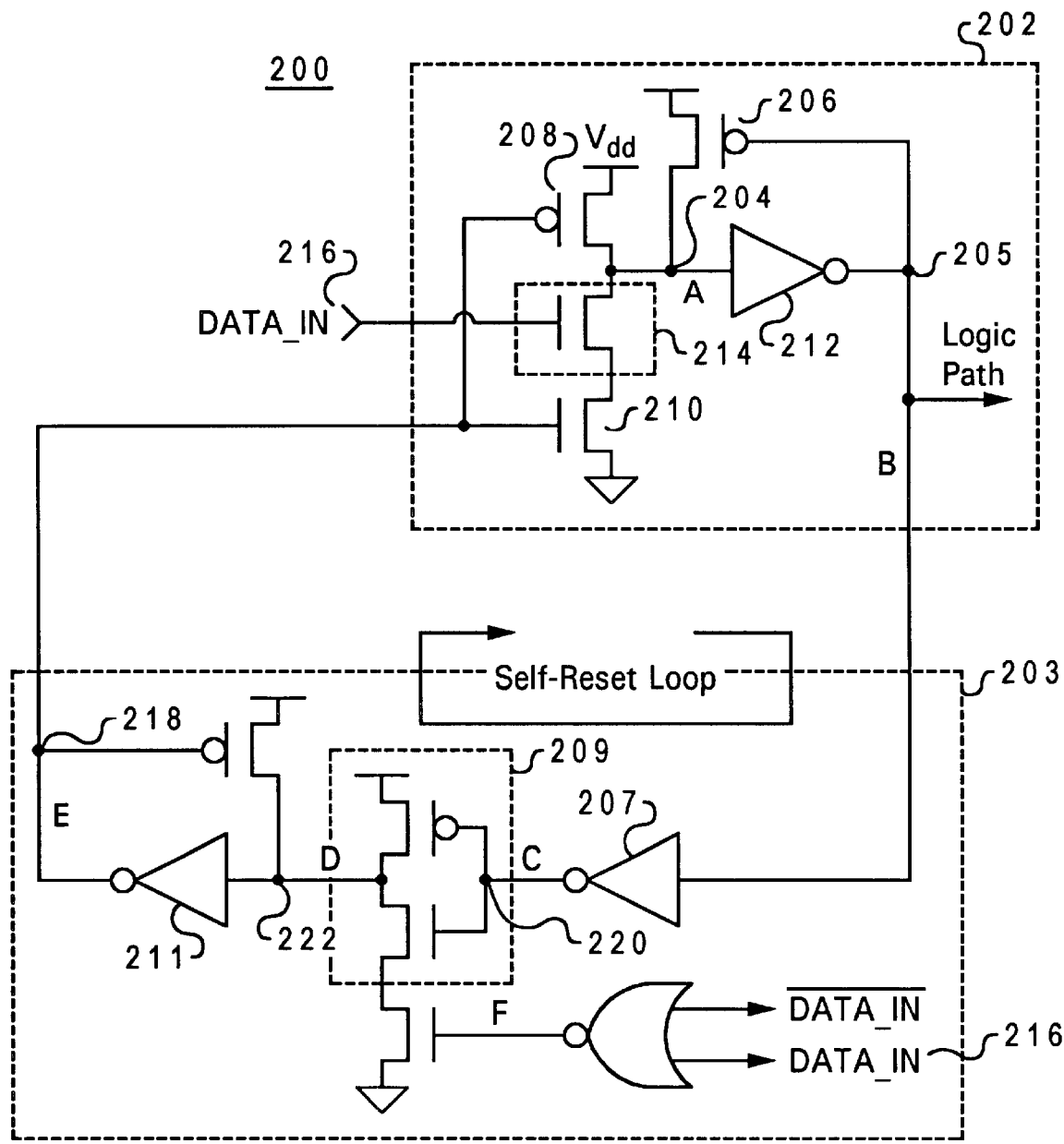
FIG. 2 is a schematic diagram illustrating fixed-timing characteristics of a conventional self-resetting logic block.

Together, RST 314 and EVAL 312, modify logic reset 414 from a fast, fixed-width pulse during normal operation (RST 314 and EVAL 312 disabled), into a longer period reset signal utilized within logic block 304 to pre-charge its dynamic node (see FIG. 2 for further explanation of pre-charging the dynamic node). Between the falling edge of RST 314 and the rising edge of EVAL 312, a PS_EN 317 is applied at a timing control input of pulse stretcher 306. The extreme voltage and temperature conditions imposed by burn-in testing results in an increased probability of noise spike occurring during the transfer of logic out 320 from logic block 304 to pulse stretcher 306. As explained in further detail with reference to FIGS. 7, 8, and 9, PS_EN 317 is a feature of the present invention which provides enhanced noise protection during the above-mentioned data transfer.

Figure 7:
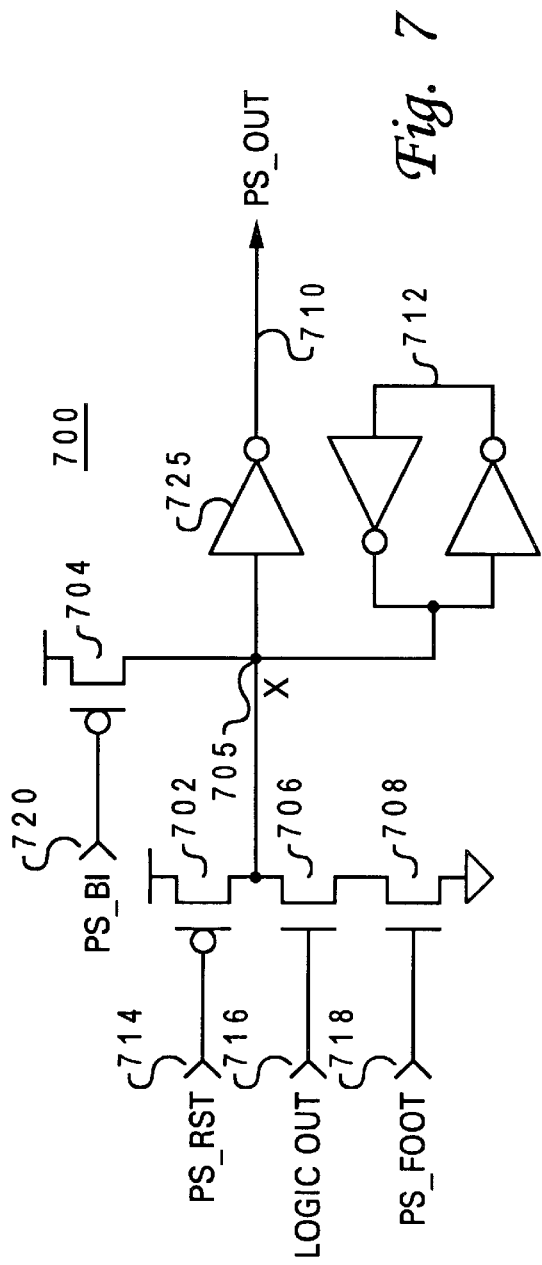
FIG. 7 depicts a pulse-stretch circuit constructed in accordance with one embodiment of the present invention.

PS_RST 319 is utilized to reset a dynamic node within pulse stretcher 306 (depicted as dynamic node 705 in FIG. 7). During burn-in testing, and as illustrated with reference to FIG. 10, PS_RST 319 is a combined logic function of CLK 310, EVAL 312, and RST 314. As depicted in FIG. 4, the falling edge of RST 314 triggers the rising edge of PS_RST 319 which is maintained at a logic high for the duration of the second half of the burn-in cycle of CLK 310. When the data output for pulse stretcher 306, PS_OUT 322, is a logic high, it is maintained at a logic high level until PS_RST 319 transitions to a logic low.

Figure 5A:
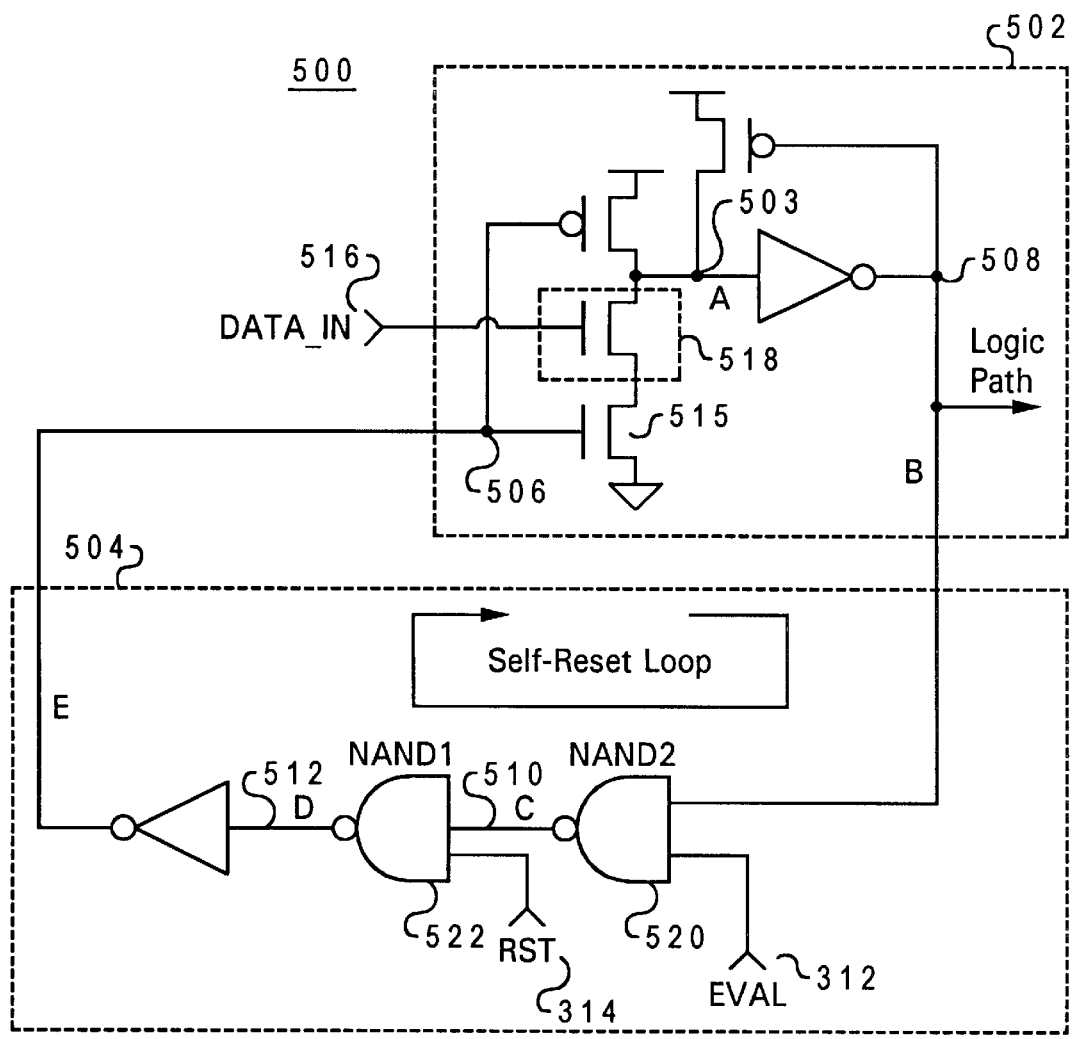
FIG. 5a depicts a self-resetting circuit having a reset timing control path constructed in accordance with one embodiment of the present invention.

With reference now to FIG. 5a, there is depicted a self-resetting circuit 500 having a reset timing control path constructed in accordance with one embodiment of the present invention. During normal operating mode (i.e., not during burn-in testing) self-resetting circuit 500 shares a similar configuration as conventional self-resetting circuit 200 of FIG. 2. In comparison with conventional self-resetting circuit 200, self-resetting circuit 500 includes a dynamic logic stage 502 and a reset delay path 504 for resetting a dynamic node after a data input 516 has been evaluated by the discharging of a logic network through an NFET 515.

As illustrated in FIG. 5a, and in an important feature of the present invention, the reset delay path 504 has been modified to include additional reset timing control signals including an EVAL input 312 and RST 314. Both EVAL 312 and RST 314 are incorporated into reset delay path 504 utilizing NAND gates 520 and 522 respectively. It should be noted that during normal (not burn-in testing) operation, EVAL 312 and RST 314 are disabled, which in the context of self-resetting circuit 500 means that they are held at a logic high.

In accordance with the method and system of the present invention, when burn-in testing commences, EVAL 312 and RST 314 are enabled. Referring back to the timing diagram of FIG. 4, EVAL 312 is activated (logic low) as the first pseudo-clock phase applied to self-resetting circuit 500 during the evaluate phase when the logic output (508 in FIG. 5 and 320 in FIGS. 3 and 4) goes high. By referencing timing diagram 400, it can be seen that EVAL 312 prolongs the high output signal from logic output 508. While EVAL 312 is at a logic low and RST 314 is a logic high, the logic output 320 remains high for a prolonged duration. When RST 314 transitions from high to a logic low, node 512 goes high and logic reset node 506 becomes low. This logic low at logic reset node 506 pre-charges dynamic node 503 to a logic high. This logic high condition at dynamic node 503 causes node 508 to go low and forces node 510 to remain high. This reseting sequence is in contrast to the operation of reset delay path 203 of FIG. 2 in which the logic output propagates through a first inverter 207 to produce a logic high pulse which maintains a fixed pulse width as it propagates through inverters 209 and 211 and returns to reset node 218.

At NAND1 522, RST 314 is combined with the logic high at node 510 to generate a prolonged (rather than simply delayed) reset signal delivered to a reset node 506. Thus, NAND2 520 in conjunction with EVAL 312 serve to prolong the period during each burn-in cycle over which individual components in the "logic out" path, such as NFET 515 as well as transistors within logic network 518 are maintained in a "switched on" condition. Similarly, NAND1 522 in conjunction with RST 314 serve to prolong the period during each burn-in cycle over which individual components in the "reset path" are maintained in an active state. In the above-described manner, EVAL 312 applied through NAND2 520 and RST 314 applied through NAND1 522 act to "cut" the feedback loop originating from logic out 508 through reset delay path 504 at two distinct junctions—node 510 and an output node 512 from NAND1 522.

Figure 5B:
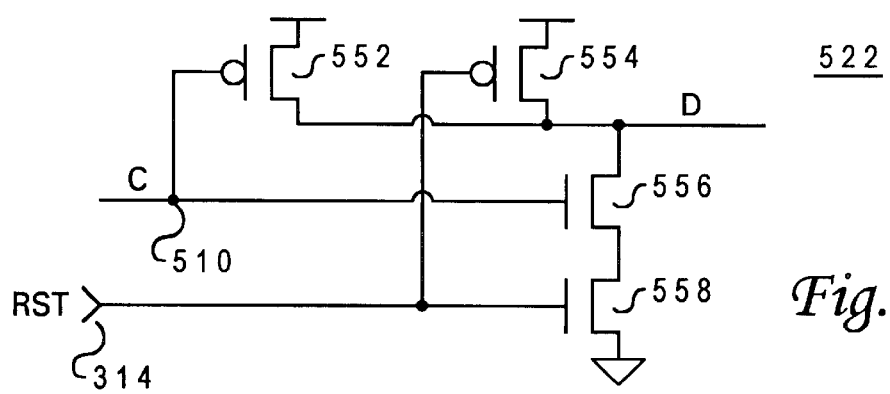

A problem may arise, however, if it is desired to adequately stress all devices within NAND1 522 during burn-in testing. FIG. 5b illustrates a transistor level diagram of NAND1 522 within reset delay path 504 depicted in FIG. 5a. In the depicted example, NAND1 522 comprises PFETs 552 and 554 as well as NFETs 556 and 558. As previously explained, node 510 is maintained at a logic high during the entire burn-in cycle. This logic high condition at node 510 results in a PFET 552 remaining inactive (switched off) during the entire burn-in cycle. In order to properly test all transistors within the implemented burn-in test structure, the method and system of the present invention may include a specialized logic gate illustrated in FIG. 6.

Figure 6:
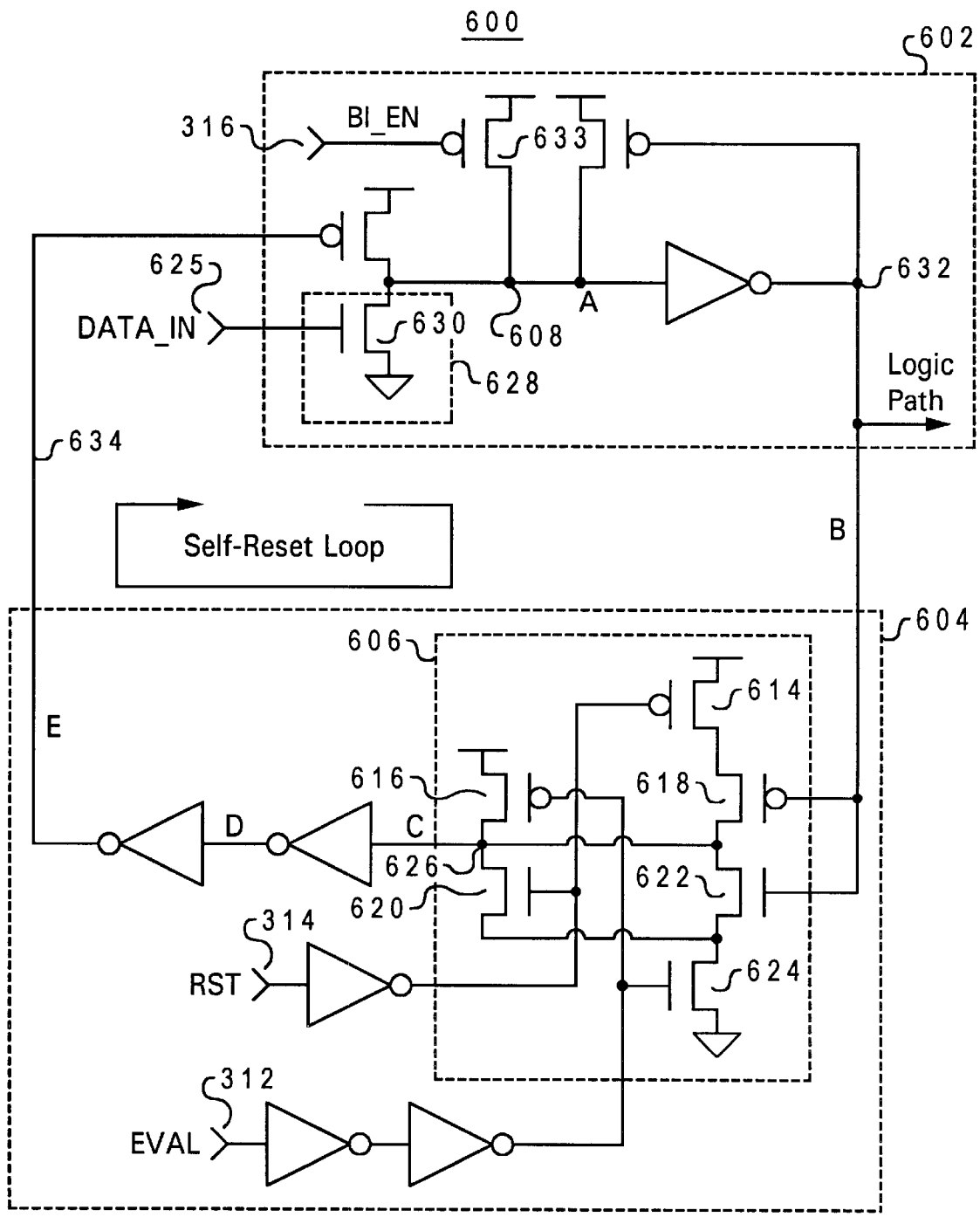
FIG. 6 illustrates a self-resetting circuit having a reset timing control path in accordance with an alternate embodiment of the present invention.

FIG. 6 illustrates a self-resetting circuit 600 having a reset timing control path in accordance with an alternate embodiment of the present invention. In order to prevent the unipolar problem associated with the embodiment depicted in FIGS. 5a and 5b, two selectively applicable burn-in test inputs, EVAL 312 and RST 314, are applied within a delay reset path 604 to a complex gate 606, such that the self-reset loop provided from the logic output of a dynamic logic block 602 is cut once rather than twice. Complex gate 606 comprises three PFETs 614, 616, and 618, and three NFETs 620, 622, and 624. As shown in FIG. 6, RST 314 is inverted and delivered to the gate terminals of PFET 614 and NFET 620. EVAL 312 is twice inverted and applied to the gate terminals of PFET 616 and NFET 624.

The configuration of complex gate 606 permits node 626 to operate as an ordinary inverter when RST 314 and EVAL 312 are disabled. During burn-in testing, and again referring to FIG. 4, node 626 is held at a logic high while EVAL is low. However, when EVAL 312 is switched to a logic high while RST 314 remains low, node 626 switches to a logic low, thus avoiding the static device problem encountered with respect to NAND1 522. Table 2 below illustrates the relative logic state of each of nodes 632, 626, and 634, encountered serially in reset delay path 604.

TABLE 2

Reset Delay Logic States

| RST | EVAL | Node 632 | Node 626 | Node 634 | State |
| --- | --- | --- | --- | --- | --- |
| HIGH | HIGH | — | — | — | Normal Operation |
| — | LOW | — | HIGH | HIGH | Evaluate Mode |
| LOW | HIGH | — | LOW | LOW | Precharge Mode |

Self-resetting circuit 600 addresses a second issue which arises if a data input 625 (latch output) has a fixed pulse width during normal (not burn-in testing) operation. If a pulse at data input 625 is a fast fixed pulse of, say 350 ps, a first gate 630 within logic block 628 does not have to be "FOOTed" with a foot device such as NFET 515 of FIG. 5. Eliminating the foot device enhances circuit speed performance in terms of switching speed. This benefit of self-resetting circuit 600 is realized during normal mode or burn-in testing operation since reset delay path 604 provides a sufficiently prolonged delay such that no direct (short) path from $V_{dd}$ to ground exists during a given cycle.

Self-reset circuit 600 is also constructed for enhanced resistance to circuit noise in the data path during burn-in testing. Burn-in testing is characterized by high-temperature and high voltage conditions which are particularly conducive to voltage spikes. As illustrated in FIG. 6, a noise suppression device, PFET 633, has been added to dynamic node 608. During normal mode (not burn-in), a BI_EN signal 316 is held high (disabled) to disable the noise suppression device, PFET 633.

During burn-in testing, BI_EN 316 is held low (activated). While BI_EN is held low, the gate-to-source voltage of PFET 633 is $-V_{dd}$, thus activating PFET 633. With PFET 633 activated, the circuit topology of logic block 602 changes from purely dynamic into a pseudo-NMOS type structure which prevents noise spikes from initiating a reset condition within reset delay path 604. The very low test cycle frequencies typical of burn-in testing in conjunction with the prolonged I/O data signals permits the utilization of PFET 633 as a noise suppression device. While activated during burn-in testing, PFET maintains dynamic node 608 at a logic high. A voltage spike at data input 625 will generally not be of sufficient duration to cause dynamic node 608 to discharge against the countervailing charging of PFET 633. PFET 633 has a carefully determined geometry such that when a valid data input arrives at data input 625 during burn-in testing, the pull-down strength of NFET 630 overcomes the pull-up strength of PFET 633. BI_EN is held high to switch PFET 633 off during normal mode operations when much higher frequency data input signals are expected at data input 625.

As illustrated in FIG. 3, dynamic logic families may include a pulse-stretch circuit for ensuring that the output at the last logic stage within a dynamic logic block is available to meet the receiving latch's hold time requirement regardless of operating frequencies. For a more detailed explanation of newly developing techniques for implementing such pulse-stretching functionality, reference is made to the subject matter in IBM patent application docket number AT9-99-698 which is incorporated herein by reference.

Figure 9:
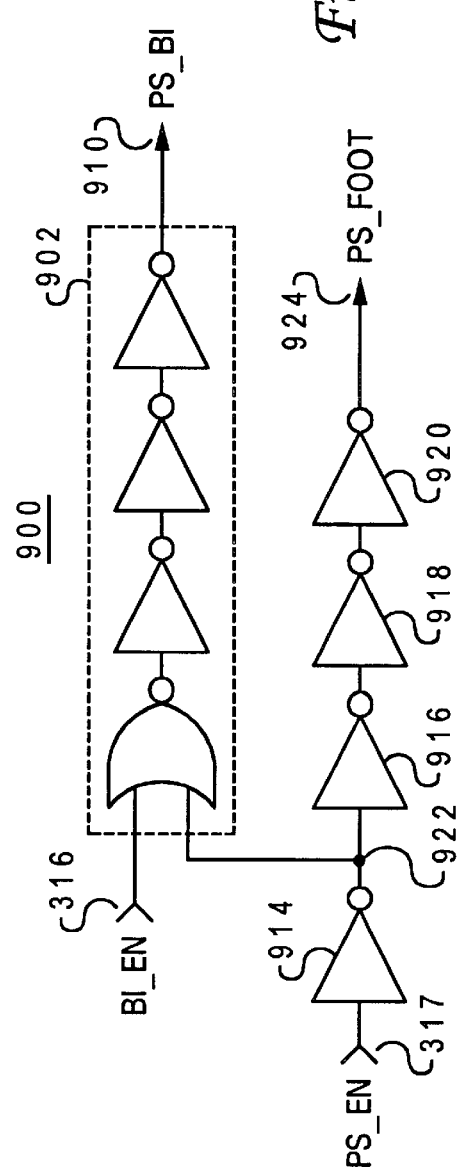
FIG. 9 depicts a pulse-stretch control block for providing burn-in timing control signals to the pulse stretch circuits illustrated in FIGS. 7 and 8 in accordance with one embodiment of the present invention.

FIG. 7 depicts a pulse-stretch circuit 700 constructed in accordance with one embodiment of the present invention. As shown in FIG. 7, pulse-stretch circuit is itself a domino style dynamic circuit comprising a data input device, NFET 706, a storage device 712, and timing control circuitry constructed in accordance with the method and system of the present invention. This timing control circuitry includes a dynamic node 705 which is pre-charged in accordance with a PS_RST signal 714 (analogous to PS_RST 319 of FIG. 3) applied to a PFET 702. A PS_FOOT device (NFET) 708 may be required to prevent a rail-to-rail short circuit condition. NFET 708 is enabled by a PS_FOOT signal 718 which is produced from PS_EN 317 as depicted in FIG. 9. Similarly to self-resetting circuit 600, pulse-stretch circuit 700 includes a selectable PFET 704 which may be activated by a PS_BI signal only during a data transfer period to avoid malfunctions due to noise.

Figure 10:
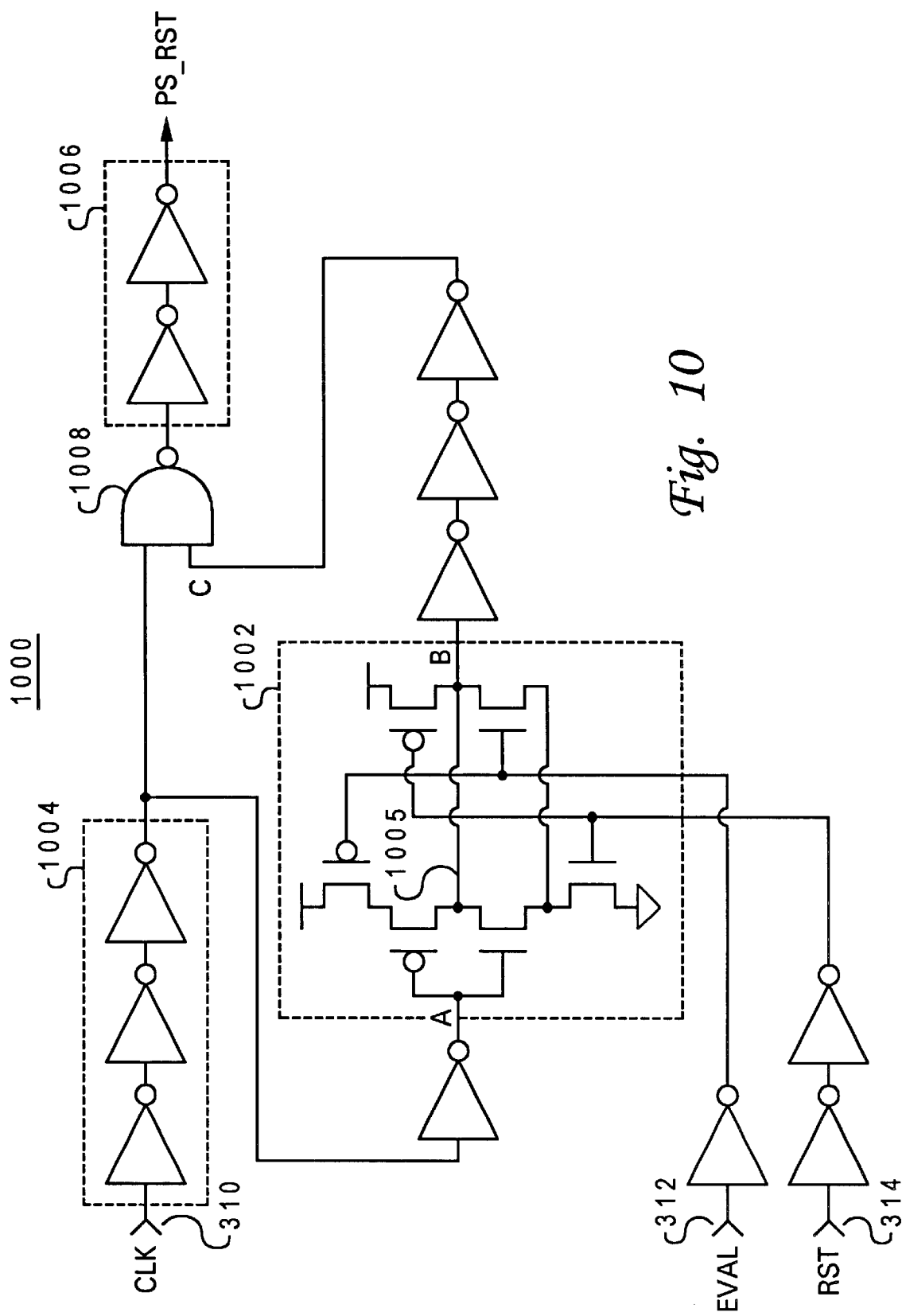
FIG. 10 illustrates a pulse-stretch control block for providing burn-in timing control signals to the pulse stretch circuits illustrated in FIGS. 7 and 8 in accordance with one embodiment of the method and system of the present invention.

During normal operation, pulse-stretch circuit 700 operates such that the target delay and the receiving latch's hold requirements are both met. Referring to PS_RST 319 of FIG. 4, an exemplary implementation of PS_RST 714 is illustrated in the context of the data transfer occurring between EVAL 312 and RST 314. The method and system of the present invention includes means for generating PS_RST 319, utilizing a control circuit depicted in FIG. 10. FIG. 10 illustrates a pulse-stretch control block 1000 for generating PS_RST 319 which is applied to the pulse-stretch circuits as illustrated in FIGS. 7 and 8 in accordance with the method and system of the present invention.

Turning to FIG. 10, a pulse-stretch control block 1000 is depicted which comprises a triple inverter module 1004 receiving clock signal, CLK 310, and delivering a delayed and inverted version of CLK 310 to a NAND gate 1008. Similar in construction and effect to complex gate 606 of FIG. 6, pulse-stretch control block 1000 includes a complex gate 1002 to which EVAL 312 and RST 314 are applied, such that a path node 1005 toggles between logic high and low during each burn-in test cycle. When EVAL 312 is a logic low, node 1005 is held at a logic high. Node 1005 toggles to a logic low when EVAL 312 transitions to a logic high while RST 314 is low. This toggling at node 1005 prevents any of the transistors within complex gate 1002 from remaining static during a burn-in cycle. Returning to FIG. 7, it can be seen that in accordance with the teachings of the present invention, the output circuitry including NFETs 706 and 708, as well as the transistors comprising inverter 725 are held in an active state for a prolonged period of time as determined by PS_RST 714 which in turn, varies as a function of EVAL 312 and RST 314.

Figure 8:
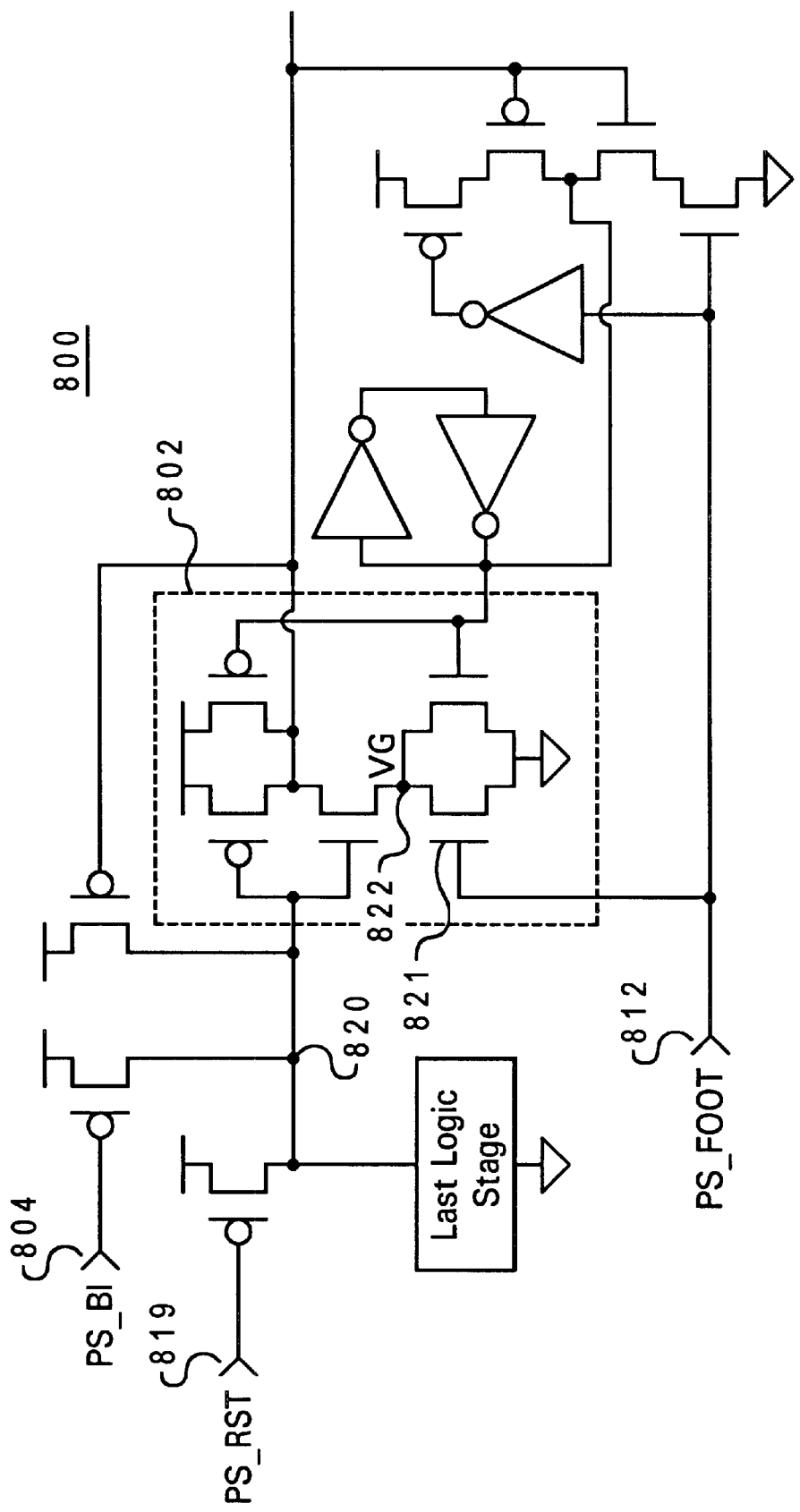
FIG. 8 illustrates a pulse stretcher constructed in accordance with an alternate embodiment of the present invention.

FIG. 8 illustrates an alternate embodiment of the present invention in which output buffer 725 is replaced by a testable buffer 802 within a pulse-stretcher 800. Like pulse-stretch circuit 700, pulse stretcher 800 operates in accordance with dynamic logic principles. PS_RST 319 is received as controllable pre-charge signal for dynamic node 820. In accordance with the teachings of the present invention testable buffer 802 is constructed such that a ground interrupt device such as NFET 708 in FIG. 7 is no longer necessary. As shown in FIG. 8, while PS_FOOT 812 is maintained at logic high, NFET 821 is activated, thus causing node 822 to act as a virtual ground during normal mode operations.

Turning now to FIG. 9, there is depicted a pulse-stretch control block 900 for providing burn-in timing control signals to the pulse stretch circuits illustrated in FIGS. 7 and 8 in accordance with one embodiment of the present invention. As shown in FIG. 9, BI_EN 316 is applied together with signal 922, to even-number inversion module 902 to generate PS_BI 910 (PS_BI 720 in FIG. 7 or PS_BI 804 in FIG. 8). PS_FOOT 924 corresponds to PS_FOOT 718 in FIG. 7 and PS_FOOT 812 in FIG. 8.

While the invention has been particularly shown and described with reference to a preferred embodiment, it will be understood by those skilled in the art that various changes in form and detail may be made therein without departing from the spirit and scope of the invention.

What is claimed is:

1. A system for ensuring comprehensive testing coverage of components within a dynamic logic macro during a burn-in test cycle, said system comprising:
   a dynamic logic block within said dynamic logic macro having a self-reset loop for generating a reset signal, wherein operation of said dynamic logic block during said burn-in test cycle includes an evaluate phase followed by a reset phase; and
   at least one burn-in test input selectively applicable to said self-reset loop for modifying durations of signals within said dynamic logic macro related to said reset signal, said at least one burn-in test input including an EVAL signal input for selectively extending said evaluate phase and a RST signal input for selectively extending said reset phase.

2. The system of claim 1, wherein during said evaluate phase, said dynamic logic block generates a logic output received by said self-reset loop, and wherein said self-reset loop comprises a first NAND gate for converting said logic output and said EVAL signal into a prolonged evaluate signal for extending said evaluate phase.

3. The system of claim 2, wherein said self-reset loop further comprises a second NAND gate for converting said prolonged evaluate signal and said RST signal into a prolonged reset signal for extending said reset phase.

4. The system of claim 1, wherein said dynamic logic block generates a logic output received by said self-reset loop, and wherein said self-reset loop further comprises a complex gate comprising logic for converting said logic output and said EVAL signal into a prolonged evaluate signal for extending said evaluate phase, and wherein said complex gate further comprises logic for converting said logic output and said RST signal into a prolonged reset signal for extending said reset phase, wherein said complex logic gate comprises a plurality of transistors configured such that each of said plurality of transistors is activated for a portion of said burn-in cycle.

5. The system of claim 2, wherein said dynamic logic macro further comprises a dynamic logic pulse stretcher for delivering data output from said dynamic logic block to an output latch, said system further comprising a control circuit for converting signals from said EVAL signal input and signals from said RST signal input into a PS_RST signal for resetting said dynamic logic pulse stretcher.

6. The system of claim 5, wherein said burn-in test cycle conforms to a clock input, and wherein said control circuit comprises logic for converting signals from said clock input, said EVAL signal input, and said RST signal input into a prolonged PS_RST signal during said burn-in test cycle.

7. The system of claim 1, further comprising an input latch providing a data input to said dynamic logic block, wherein said at least one burn-in test input is selectively applied to said input latch during burn-in testing.

8. A system for ensuring comprehensive testing coverage of components within a dynamic logic macro during a burn-in test cycle, said system comprising:
   a dynamic logic block within said dynamic logic macro having a self-reset loop for generating a reset signal, wherein said dynamic logic block includes a precharge device for precharging a dynamic node with said dynamic logic block in response to said precharge device receiving said reset signal;
   a noise-suppression transistor for recharging said dynamic node in response to said precharge device receiving a noise spike input;
   a noise-suppression signal for selectively enabling said noise-suppression transistor, such that said dynamic node may suppress propagation of noise during said burn-in cycle; and
   at least one burn-in test input selectively applicable to said self-reset loop for modifying durations of signals within said dynamic logic macro related said reset signal.

9. A method for ensuring comprehensive testing coverage of components within a dynamic logic macro comprising a dynamic logic block having a self-reset loop for generating a reset signal during a burn-in test cycle, wherein operation of said dynamic logic block during said burn-in test cycle includes an evaluate phase followed by a reset phase, said method comprising the step of:
   selectively applying at least one burn-in test input to said self-reset loop, such that said reset signal is modified during burn-in testing to adequately stress said components within said dynamic logic macro during said burn-in test cycle, said step of selectively applying at least one burn-in test input to said self-reset loop including:

selectively applying an EVAL signal to said self-reset loop to extend said evaluate phase; and selectively applying a RST signal to said self-reset loop to extend said reset phase.

10. The method of claim 9, wherein during said evaluate phase, said dynamic logic block generates a logic output received by said self-reset loop, and wherein said self-reset loop comprises a first NAND gate, said method further comprising the step of converting said logic output and said EVAL signal within said first NAND gate into a prolonged evaluate signal for extending said evaluate phase.

11. The method of claim 10, wherein said self-reset loop further comprises a second NAND gate, and wherein said method further comprises the step of converting said prolonged evaluate signal and said RST signal within said second NAND gate into a prolonged reset signal for extending said reset phase.

12. The method of claim 10, wherein said dynamic logic macro further comprises a dynamic logic pulse stretcher for delivering data output from said dynamic logic block to an output latch, said method further comprising the step of converting said EVAL signal and said RST signal into a PS_RST signal for resetting said dynamic logic pulse stretcher.

13. The method of claim 12, wherein said burn-in cycle is applied in accordance with a clock input, and wherein said method further comprises the step of converting said clock input, said EVAL signal, and said RST signal into a prolonged PS_RST signal during said burn-in cycle.

14. The method of claim 9, wherein said dynamic logic macro further comprises an input latch for providing a data input to said dynamic logic block, and wherein said method further comprises the step of selectively applying at least one burn-in test input to said input latch during burn-in testing.

* * * * *